United States Patent [19]

Helmer et al.

[11] Patent Number: 5,482,611
[45] Date of Patent: Jan. 9, 1996

[54] PHYSICAL VAPOR DEPOSITION EMPLOYING ION EXTRACTION FROM A PLASMA

[76] Inventors: John C. Helmer, 260 S. Balsamina Way, Palo Alto, Calif. 94028; Kwok F. Lai, 959 Van Auken Cir., Palo Alto, Calif. 94303; Robert L. Anderson, 3169 Emerson, Palo Alto, Calif. 94306

[21] Appl. No.: 133,595

[22] Filed: Oct. 8, 1993

Related U.S. Application Data

[63] Continuation-in-part of Ser. No. 768,498, Sep. 30, 1991, abandoned.

[51] Int. Cl.$^6$ .................................................. C23C 14/35
[52] U.S. Cl. ........................ 204/298.17; 204/192.12; 204/298.05; 204/298.06; 204/298.07; 204/298.09
[58] Field of Search ................ 204/298.05, 298.06, 204/298.07, 298.09, 298.16, 298.17, 298.18, 192.12; 427/523

[56] References Cited

U.S. PATENT DOCUMENTS

| | | | |
|---|---|---|---|
| 3,369,990 | 2/1968 | Hallen et al. | 204/298.07 |
| 3,962,988 | 6/1976 | Murayama et al. | 118/723 VE |
| 4,039,416 | 8/1977 | White | 427/523 |
| 4,046,660 | 9/1977 | Fraser | 204/192.12 |
| 4,420,386 | 12/1983 | White | 427/526 |
| 4,588,490 | 5/1986 | Cuomo et al. | 204/298.06 |
| 4,622,121 | 11/1986 | Wegmann et al. | 204/298.18 |
| 4,655,893 | 4/1987 | Beale | 204/192.15 |
| 4,732,761 | 3/1988 | Machida et al. | 437/228 |
| 4,824,544 | 4/1989 | Mikalesen et al. | 204/298.06 |
| 4,915,805 | 4/1990 | Rust | 204/192.12 |
| 4,925,542 | 4/1990 | Kidd | 204/192.31 |
| 4,950,956 | 8/1990 | Asamaki et al. | 315/111.21 |
| 4,966,677 | 10/1990 | Aichert et al. | 204/298.21 |
| 5,022,977 | 6/1991 | Matsuoka et al. | 204/298.16 |
| 5,045,166 | 9/1991 | Bobbio | 204/192.32 |
| 5,069,770 | 12/1991 | Glocker | 204/192.12 |
| 5,073,245 | 12/1991 | Hedgcoth | 204/298.21 |
| 5,178,739 | 1/1993 | Barnes et al. | 204/192.12 |
| 5,178,743 | 1/1993 | Kumar | 204/298.21 |

OTHER PUBLICATIONS

Article by N. Kumar, et al., entitled "Aluminum Deposition on Optical Fibers by a Hollow Cathode Magnetron Sputtering System", published in *Journal of Vacuum Science & Technology A*, (Vacuum, Surfaces, and Films), vol. 6, No. 3, pp. 1772–1774, May–Jun. 1988.

Article by G. Y. Yeom, et al., entitled "Cylindrical Magnetron Discharges. I. Current–Voltage Characteristics for DC– and RF–driven Discharge Sources", published in *Journal of Applied Physics*, vol. 65, No. 10, pp. 3816–3824, on May 15, 1989.

Article by H. Kawasaki, et al., entitled "High Speed Pipe Inner Coatings Using Magnetron Hollow–Cathode Discharge in a Magnetic Field", published in *Materials Science & Engineering*, (Structural Materials: Properties, Microstructure and Processing), vol. A140, pp. 682–686, on Jul. 7, 1991.

Articley by H. A. Ja'fer, et al., entitled "A Low–Voltage, High–Current, Ion–Bombardment Source Using Magnetron Principles", published in *Vacuum*, vol. 44, No. 3–4, pp. 381–383, May–Apr. 1993.

Article by V. J. Kovarik, et al., entitled "Inititation of Hot Cathode Arc Discharges by Electron Confinement in Penning and Magnetron Configurations", published in *Review of Scientific Instruments*, vol. 53, No. 6, pp. 819–821, in Jun. 1982.

(List continued on next page.)

*Primary Examiner*—Aaron Weisstuch
*Attorney, Agent, or Firm*—Gerald Fisher

[57] ABSTRACT

A sputter magnetron ion source for producing an intense plasma in a cathode container which ionizes a high and substantial percentage of the sputter cathode material and means for extracting the ions of the cathode material in a beam. The ion extraction means is implemented by a magnetic field cusp configuration with a null region adjacent to the open end of the cathode container. Ions so produced are able to be directed at right angles to a substrate being coated for efficient via filling.

29 Claims, 6 Drawing Sheets

OTHER PUBLICATIONS

Article by G. Y. Yeom, et al., entitled "Cylindrical Magnetron Discharges. II. The Formation of DC Bias in RF–Driven Discharge Sources", published in *Journal of Applied Physics*, vol. 65, No. 10, pp. 3825–3832, May 15, 1989.

Article by J. A. Thornton, entitled "Magnetron Sputtering: Basic Physics and Application to Cylindrical Magnetrons", published in *Journal of Vaccuum Science and Technology*, vol. 15, No. 2, pp. 171–177, Mar.–Apr. 1978.

Article by V. A. Gruzdev, et al., entitled "Initiation of a Discharge with a Cold Hollow Cathode by a Gas Magnetron", published in *Zhurnal Tekhnicheskoi Fiziki*, vol. 50, No. 10, pp. 2108–2111, in Oct. 1980.

Article by P. J. Blaas, et al., entitled "A Hot Cathode Magnetron Discharge for Hollow Cathode Arc Ignition", published in *Annalen der Physik*, vol. 24, No. 3–4, pp. 172–176, 1970.

Article by V. Miljevic, entitled "Hollow–Cathode Magnetron Ion Source", published in *Review of Scientific Instruments*, vol. 55, No. 1, pp. 121–123, Jan. 1984.

Article by M. Ihsan, et al., entitled "Effect of Deposition Parameters on Properties of Films Deposited on Fibers by Hollow Cathode Magnetron Sputtering", published in *Journal of Vacuum Science & Technology A*, (Vacuum, Surfaces, and Films), vol. 8, No. 3, pp. 1304–1312, May–Jun. 1990.

Article by A. Semenov, entitled "Hollow–Cathode Magnetron Discharge", published in *Zhurnal Tekhnicheskoi Fiziki*, vol. 57, No. 1, pp. 180–182, Jan. 1987.

Article by M. Shimada, et al., entitled "Compact Electron Cyclotron Resonance Ion Source with a Permanent Magnet", published in *Journal of Vacuum Science & Technology A*, (Vacuum, Surfaces, and Films), vol. 11, No. 4, pp. 1313–1316, Jul.–Aug. 1993.

T. M. Lu et al, "Partially Ionized Beam Processing: Via Filling and Planarization", Semiconductor Research Corp., Jul. 19, 1988, Reference No. C88275.

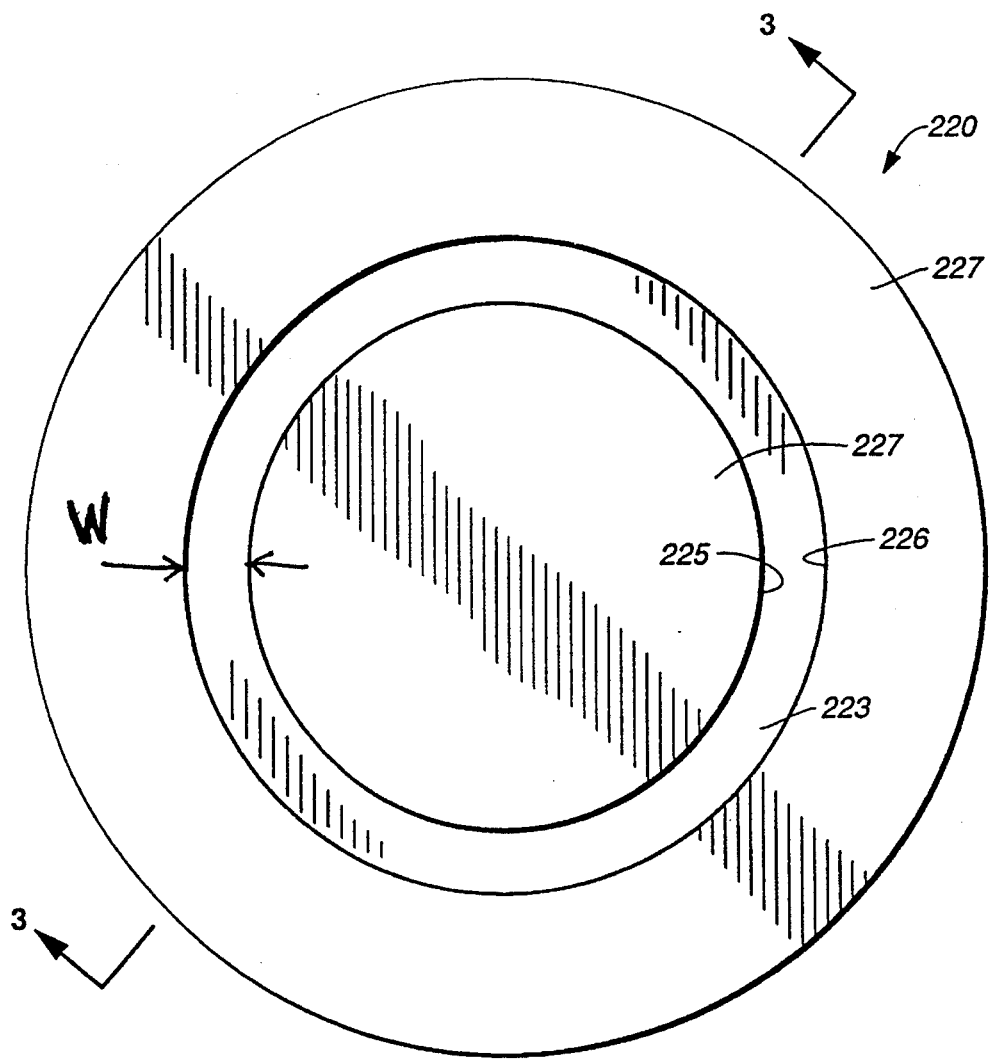
FIG._2
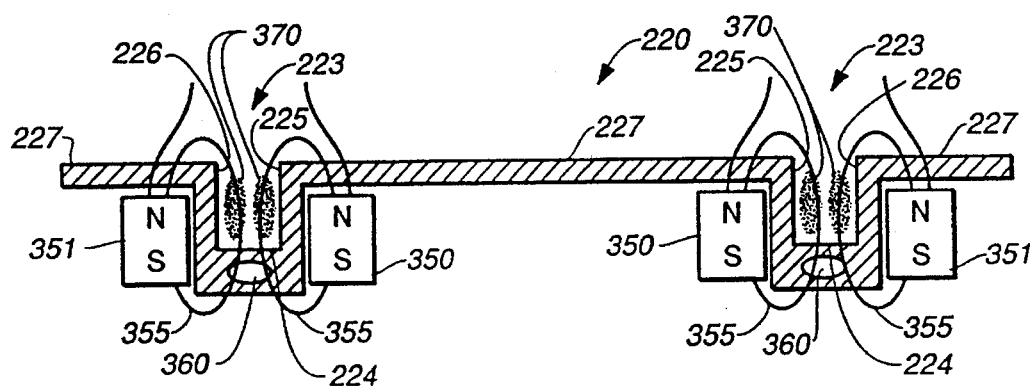
FIG._3

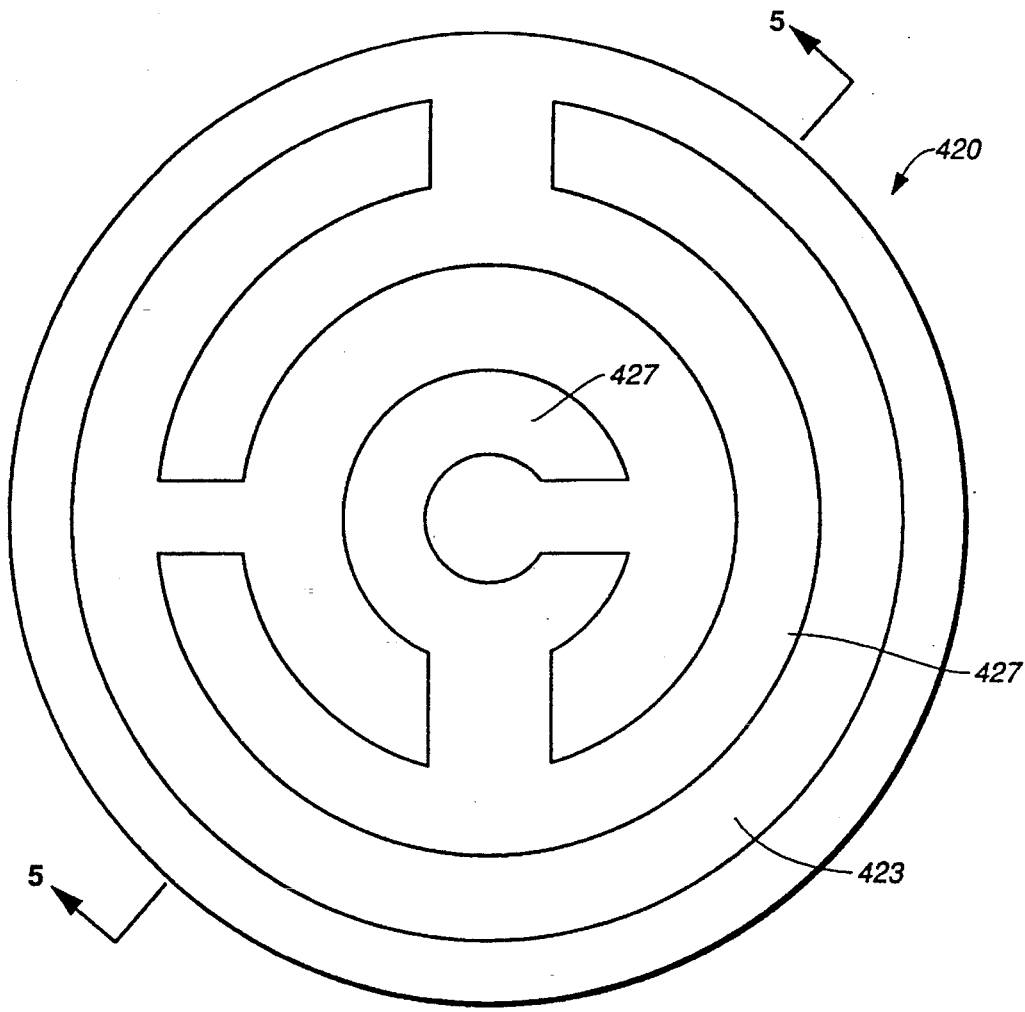
*FIG._4*
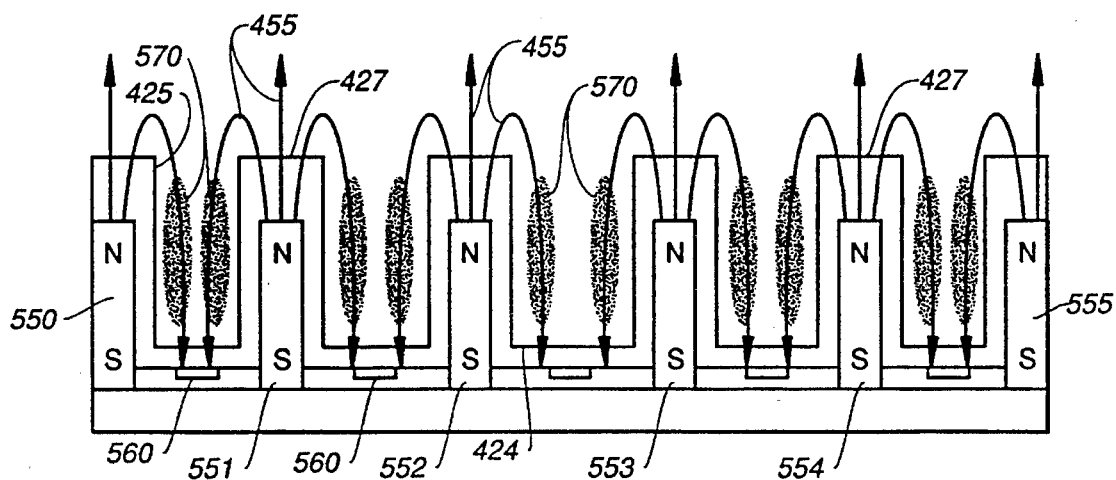
*FIG._5*

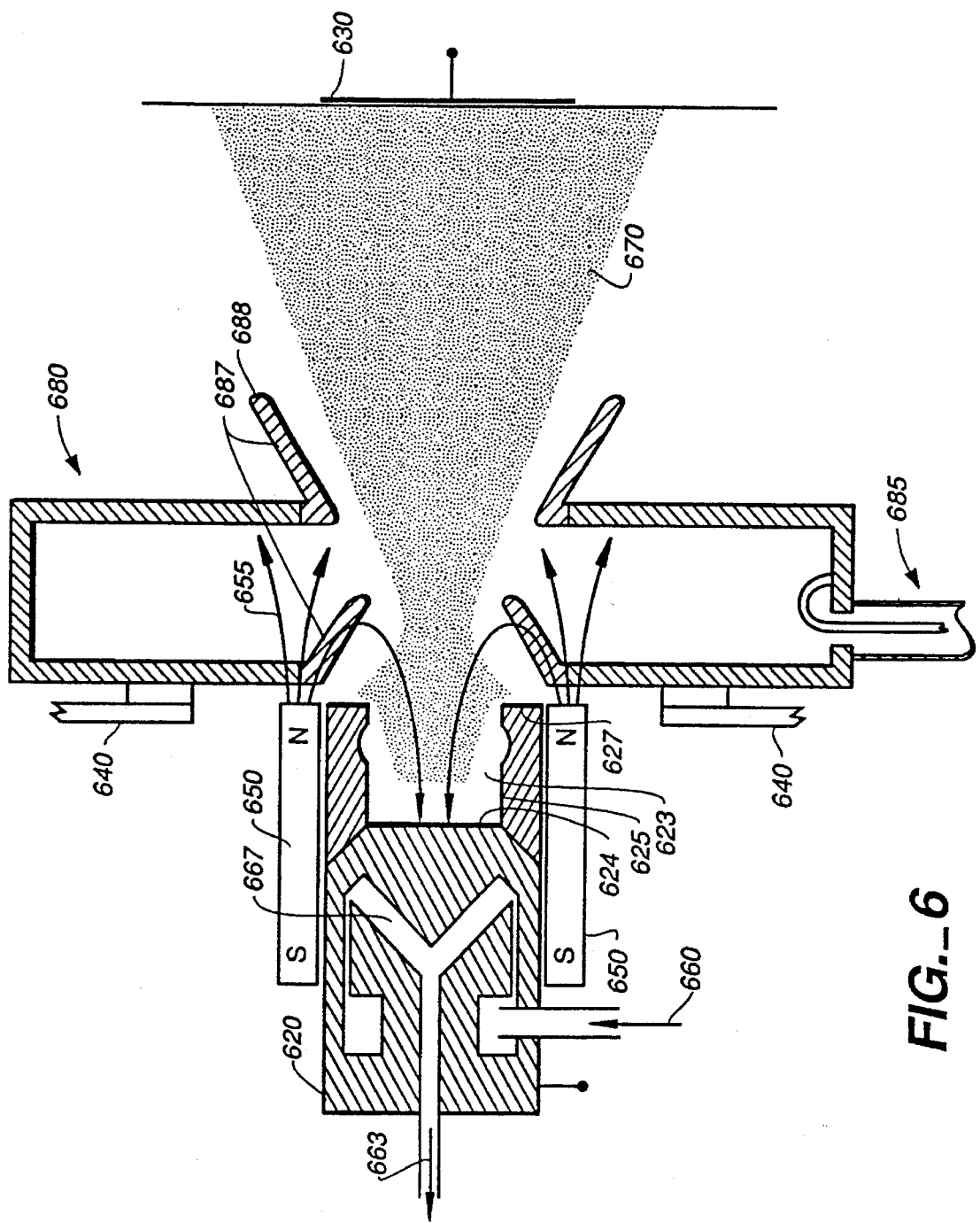
FIG._6

PHYSICAL VAPOR DEPOSITION EMPLOYING ION EXTRACTION FROM A PLASMA

This is a continuation-in-part of application Ser. No. 07/768,498, filed Sep. 30, 1991, now abandoned.

FIELD OF THE INVENTION

This invention relates to the field of thin film deposition, and is particularly related to physical vapor deposition of solid materials in connection with the fabrication of semiconductor integrated circuits.

BACKGROUND OF THE INVENTION

Deposition of a metallization layer, typically of aluminum, is a common processing step in the fabrication of very large scale integrated (VLSI) circuits on semiconductor substrates or wafers. Usually, a large number of discreet devices, sometimes referred to as integrated circuit "chips", are formed on a single wafer. Metal layers are typically used as device interconnects which are deposited only after a complex device structure has already been formed on the wafer. Frequently, it is also desired to fill small holes, known as vias, with metallization to provide electrical connection between device layers; and/or to fill narrow grooves in such devices.

Presently, the most common method of depositing thin films of aluminum or other metallization layers is by the well known process of sputtering, a form of physical vapor deposition. In a sputtering system, a plasma of an inert gas at relatively low pressure, typically argon, is created in the vicinity of a target cathode made of the material to be deposited. Ions from the plasma strike the target cathode causing atoms of the target material to be ejected. These atoms travel through the sputtering chamber and are deposited onto the semiconductor substrate. In so-called magnetron sputtering systems a magnetic field is created in the vicinity of the target to confine the electrons and intensify the plasma, thereby increasing the efficiency of the sputter source. In modern commercial sputtering systems substantially all of the atoms released from the target remain neutral i.e. approximately 98% or greater are un-ionized as they travel through the sputter chamber to the substrate. Also, the vast majority of the 2% of ionized target ions which may be formed would usually be confined by the fields along with the electrons and would not reach the substrate.

An ongoing trend in semiconductor device design is towards ever-smaller device geometries, such that the vias and grooves that must be filled with metal are now frequently less than a micron in width. This has presented a problem in connection with sputtering. It is generally understood that atoms ejected from the surface of a sputter target leave at a variety of angles and that, at the vacuum levels typically employed in sputtering systems, the mean-free-path of the ejected metal atoms is small in comparison to the distance between the target and the substrate, so that randomizing collisions occur. Thus, the metal target atoms are incident on the substrate over a wide range of angles, generally conforming to a cosine distribution.

on the other hand, when filling a via or groove of very small width, it is important that it be filled from the bottom up. If there is significant deposition on the side walls of the via or groove before the bottom is filled, then these side layers will block atoms from reaching the bottom with the result that good electrical connection will not be made. It should be apparent that significant side wall deposition will occur in the case where sputtered atoms can arrive at the wafer at angles defined by a cosine distribution.

Accordingly, it has been a goal of manufacturers of sputtering systems to provide means for imparting greater directionality to the ejected target atoms which reach the wafer. Ideally, for filling vias and grooves, sputtered atoms should arrive at an angle which is normal to the plane of the wafer.

A variety of approaches have been tried to impart greater directionality to the sputtered atoms reaching the substrate. One approach is to increase the distance between the sputter source and the substrate. Ignoring, for the moment, the effects of gas scattering, if the distance is relatively large in comparison to the diameters of the source and of the substrate, only those atoms which start out travelling at an angle close to an angle normal to the substrate will reach the substrate. This follows from the geometry of the arrangement. It should be apparent, however, that using this approach any improvement in directionality comes at a cost in system efficiency. While the geometry selects only those atoms with the proper angle of departure from the target, any other atoms ejected from the target are wasted with the consequence of very poor target utilization and a slow deposition rate. Economically, a key factor in modern commercial semiconductor fabrication is the need for increased system "throughput." Thus, an approach which increases deposition time is economically unacceptable.

Another known method of imparting greater directionality to the atoms reaching the wafer surface is to install a collimating filter between the source and the substrate. Such a filter might comprise a network of elongate cell-like structures, each cell having an axis perpendicular to the surface of the substrate. Atoms travelling approximately perpendicular to the substrate surface travel though the cells unimpeded. Atoms travelling at an acute angle are intercepted by a wall of one of the cells and captured. This approach, while providing good directionality, is also inefficient since much of the target material is wasted and builds up on the cell walls. The build up of material can lead to the undesired increase in the number of particulates in the system, making it necessary to replace or clean the collimator frequently. Nonetheless, this approach is an improvement over the approach of the preceding paragraph insofar as it allows for a more compact system.

As noted above, even if directionality is attained using either of the above methods, gas scattering reintroduces randomness in the travel angles of the target atoms. (This is less of a factor with respect to the collimation system because the overall path length is shorter and the mouths of the cells may be placed close to the wafer surface.) It is difficult to reduce gas pressure, and thereby increase the mean-free-path of the ejected atoms, without greatly diminishing the plasma density and the deposition rate. As noted above, slow deposition rates are unacceptable to commercial semiconductor device manufacturers because of the consequent decrease in system throughput.

Another solution which would provide directionality to the metal to be deposited would be some form of ion plating using an ion beam such as used in ion implantation. Ion trajectories can be controlled using known magnetic or electrostatic focussing techniques so that the ions may be directed normal to the surface of the wafer. However, the deposition rate would continue to be a problem if one were to use typical ion implantation beams, because space charge effects in these machines would prevent the use of a beam with sufficient flux to provide an acceptable deposition rate.

Another approach to improving the ability of a sputter source to fill grooves and vias has been to apply an rf bias to the wafer substrate, thereby causing a negative charge to build up in a known manner. This negative charge causes gas ions in the sputter chamber to bombard the wafer imparting a degree of surface mobility to the deposited aluminum atoms causing them to spread out along the surface. While this approach has been useful, it is limited by the fact the energy of the ions striking the substrate must be below a level which will cause damage to the partially fabricated devices present on the substrate.

Accordingly, it is an object of the present invention to provide a physical vapor deposition source for depositing metallization layers onto semiconductor wafers with an improved degree of directionality.

Another object of the present invention is to provide a directional source for depositing metal layers which has an acceptably high deposition rate.

SUMMARY OF THE INVENTION

The above objects of the present invention, along with others that will be apparent to those skilled in the art, are accomplished by producing a high intensity plasma in a narrow confining container which causes a substantial number of atoms of the target material to be ionized. The high intensity plasma is contained by a magnetic trapping field having a null which acts as a mirror. Only those electrons and ions having only an axial velocity are able to escape and be extracted.

The plasma naturally forms a low positive voltage sheath at the surface of the substrate having a potential gradient between the plasma boundary and the wafer surface. This potential gradient extracts ions of the material to be deposited from the plasma, accelerating the ions to the surface of the wafer in a highly directional manner. Alternatively, external bias can be applied to the substrate to improve directional deposition.

BRIEF DESCRIPTION OF THE DRAWINGS

FIG. 2 a plan view of a target cathode in accordance with another embodiment of the present invention.

FIG. 3 is a cross-sectional view of the embodiment of FIG. 2, taken along view lines 3—3.

FIG. 4 a plan view of a target cathode in accordance with another embodiment of the present invention.

FIG. 5 is a cross-sectional view of the embodiment of FIG. 4, taken along view lines 5—5.

FIG. 6 is a cross-sectional view of yet another embodiment of the present invention comprising a microwave source to further energize the plasma.

BRIEF DESCRIPTION OF THE INVENTION

Figure 1A:
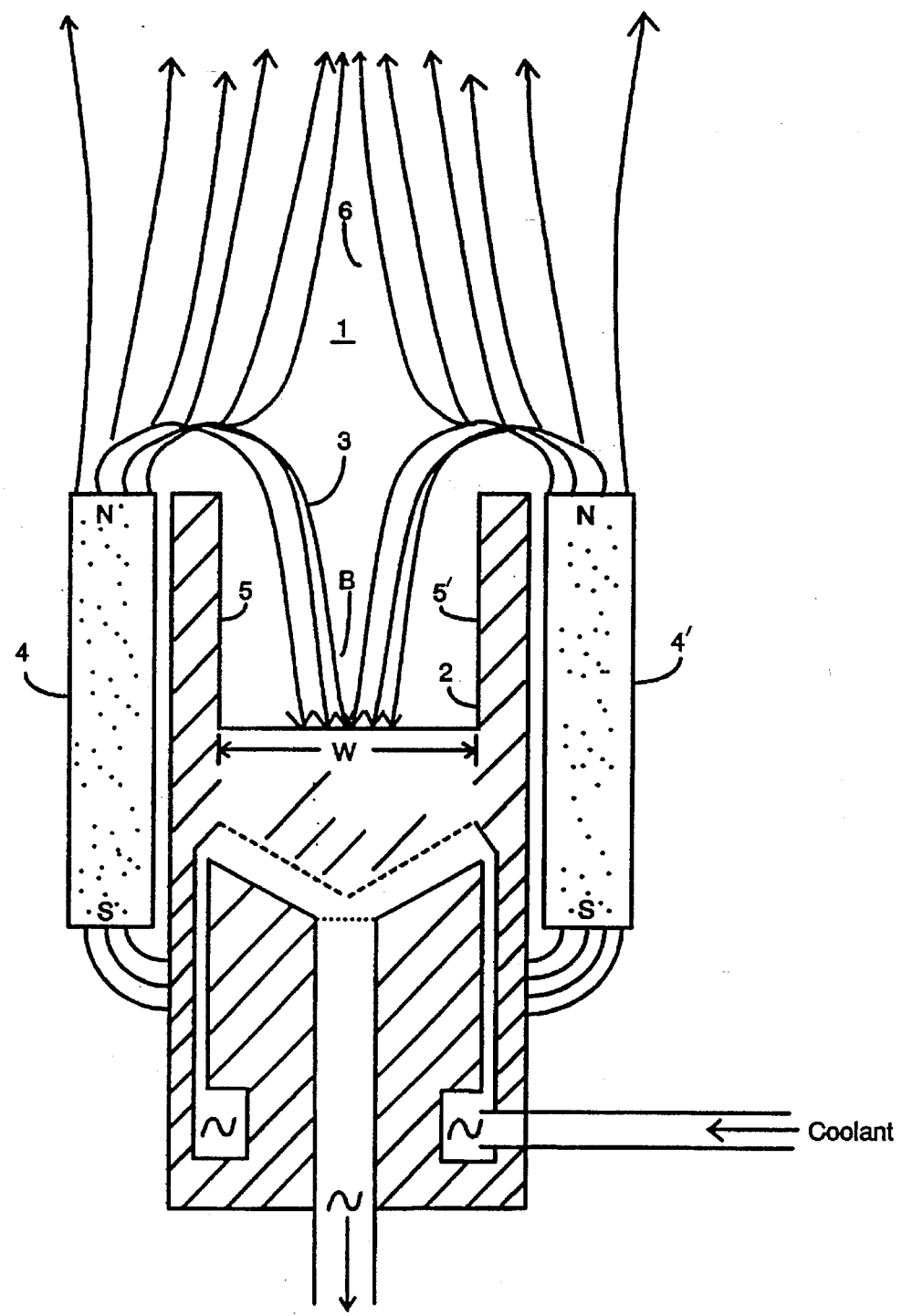
FIG. 1A is a schematic of the null-field magnetron of this invention.

FIG. 1A is a schematic cross section of the inventive null-field magnetron which illustrates the principles and advantages of our invention. By providing a magnetic field having a magnetic null region 1 at the opening of container 2, we are able to trap and retain ions and electrons inside the container 2 except for those particles which have entered into the null region at the upper edge 6 of the region 3 with axial velocity and very little radial velocity. Ions and electrons which have primarily axially velocity are able to leave the container along the axis at the upper edge of the region. Other particles are reflected back and retained in the container.

In addition, the arrangement of the permanent magnet 4, 4' as shown in FIG. 1A provides magnetic field lines inside of container 2 which loop around so that the magnetic field lines are parallel to the surfaces of 5 and 5' and cause trapping of the electrons and ions in the vicinity of the container walls 5 and 5' as in standard sputter magnetron fashion.

In the configuration of our invention, the width and depth of the container are on the same order dimensionally. This configuration provides a high probability that sputtered neutral target atoms which leave surface 5 or 5' will be either ionized by the highly intense plasma or will be redeposited on the opposite wall and then resputtered back toward wall 5. Assuming cylindrical symmetry for the FIG. 1A schematic, a single electromagnet would not be able to satisfy the two requirements for the magnetic field provided by magnet 4–4'. A single electromagnet could not provide the magnetic null field region. A plurality of electromagnets could be arranged to satisfy these requirements, but we prefer a single toroidal magnet 4 for the cup-like plasma container 2 or bar type magnets 4 and 4' for the configuration where the plasma container 2 is a groove.

Figure 1B:
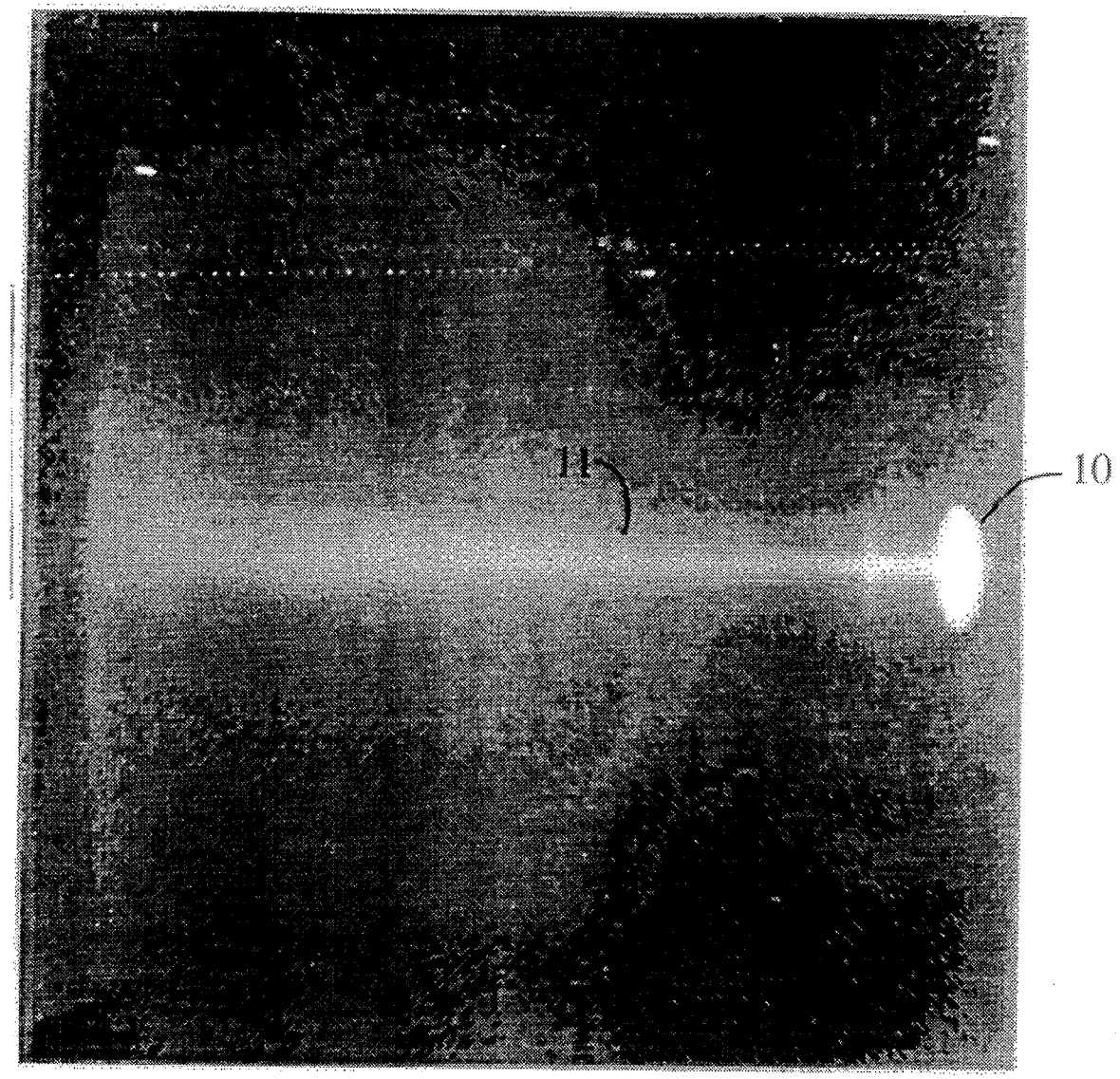
FIG. 1B is a digitized image of an extracted plasma beam showing how the plasma can only stream from the center of the null-field magnetron of the invention.

FIG. 1B is derived from a photograph which clearly illustrates that the plasma streams from only the central region 10 of a cylindrical cathode container having a null-field magnet according to our invention. Obviously, the plasma is excited sufficiently to provide the optical radiation shown in FIG. 1B which illustrates the operative mechanism of our magnetron invention in which plasma only leaves the confinement container along the axis. The shape of the magnetic field providing the field null acts as a "mirror" that reflects most of the charged particles, i.e. electrons to sustain a high density plasma within the hollow cathode. A magnetic mirror has a loss-cone that allows a small fraction of the electrons to escape through the magnetic null to the outside world. To maintain charge balance, positive ions will be dragged along with the electrons by ambipolar diffusion. As a result, a beam of ionized target ions is developed and emitted from the center of the opening of the hollow confining container.

There are several distinct advantages of using a magnetic mirror to extract the plasma. Once the electrons leave the discharge region, the null mirror isolates the electrons in the plasma and prevents the beam from coupling with the electrons inside the hollow cathode. Therefore, the exiting plasma beam can be manipulated or biased without affecting the discharge characteristics to the cathode. By isolating the extracted plasma from the discharge, the confining null-field magnetron cathode is far more flexible than most other plasma sources. Another valuable property is the quality of the plasma beam. To escape through the loss-cone of a mirror, the magnetic moment of the escaped electrons has to be smaller than the mirror ratio of the mirror. As a result, the transverse velocity of the plasma beam is very small. This allows the plasma beam to be steered, focused or expanded using small magnetic or electric fields.

For a one dimensional model of our confining cathode, $$V_{ionize} = n_e V_e \sigma T_n$$

where:

$n_e$ is average electron density $V_e$ is electron velocity

σ is total ionization cross-section by electron impact $T_n$ is mean lifetime of the neutral before redeposition.

and $V_{ionize}$ is the average number of ionization collisions had by a neutral atom by electron impact in the confining cathode of our invention.

The fraction of sputtered neutrals or the ionization efficiency is given by $f=1-\exp(-V_{ionize})$.

It can be shown that $V_{ionize}$ is proportional to $n_e$ and to the width W of the confinement cathode since $T_n$ is proportional to W. Electron density increases with power applied; however, power would be proportional to $W^3$ but cooling capability is proportional to surface area or $W^2$. Accordingly, the electron density cannot be increased indefinitely by increasing W since at some dimension the cathode temperature would exceed its mechanical stability/melting point. This suggests that increased plasma can be obtained by increasing the cathode size in the direction perpendicular to its width while maintaining W at an efficient cooling configuration, i.e. making a trench.

Electron temperature in a confining cathode structure is inversely proportional to its operating pressure. When the electron temperature is higher than the ionization energy of the atom, it can be shown that $$V_{ionization} = W N_c \sigma_{max} \sqrt{\frac{Mn}{mX_i}} \times \frac{\sqrt{\pi}}{2}$$

where $\sigma_{max}$ is ionization cross section at the optimum electron energy $M_n$ is mass of atom W is width of containment m is mass of electron $X_i$ is $E_n/Kt_e$ $E_n$ is average energy of sputtered neutral $T_e$ is electron temperature $E_i$ is ionization energy of the neutral For an aluminum confining cathode of cylindrical design with W=1.9 cm and a length of 1.0 inch, at 3 KW measured input power, we determined the $N_e$ near the waist of the plasma beam to be near $10^{13}$ cm$^{-3}$. The electron temperature at 2millitorr was 8 eV. With these parameters and $E_n$ =5.985 eV, $V_{ionize}$ was computed to be 0.795. This corresponds to an ionization efficiency Eff.=54.8%. This calculation shows that 54.8% of the sputtered atoms are ionized.

We believe this calculation is conservative but it is in sharp contrast to the 2% target ionization efficiency for prior art sputter magnetrons. This means that less than 2.0% of the sputtered atoms in the prior art plasma are ionized. It is also noted that due to the geometry, most of the un-ionized target atoms are captured by redeposition on the opposite wall and only an extremely small percentage of neutral atoms can reach a substrate by line of sight deposition. This implies that ionized metal in the extracted plasma beam can be as high as 90%.

The term "plasma potential" means a voltage which arises due to the different mass of ions and electrons in the plasma. Because electrons move much faster and leak off and are more readily captured, the plasma develops a positive potential. The terms "sheath potential" defines the voltage level between a particular surface and the plasma. The sheath potential can be any value because it can be determined by an external biasing power supply or it could be the potential which arises if a surface is allowed to float. It has been determined that the plasma potential on the cathode container side of the null point 6, in region 1 is at a somewhat higher positive potential than the plasma potential in extracted region 11 outside of the null point 6. Accordingly, the plasma beam which extends out toward the substrate 130 (FIG. 1C) has a positive plasma potential and so long as the substrate is more negative than the plasma potential in viscosity, positive ions will be attracted from the plasma to the substrate.

DETAILED DESCRIPTION OF THE INVENTION

Figure 1C:
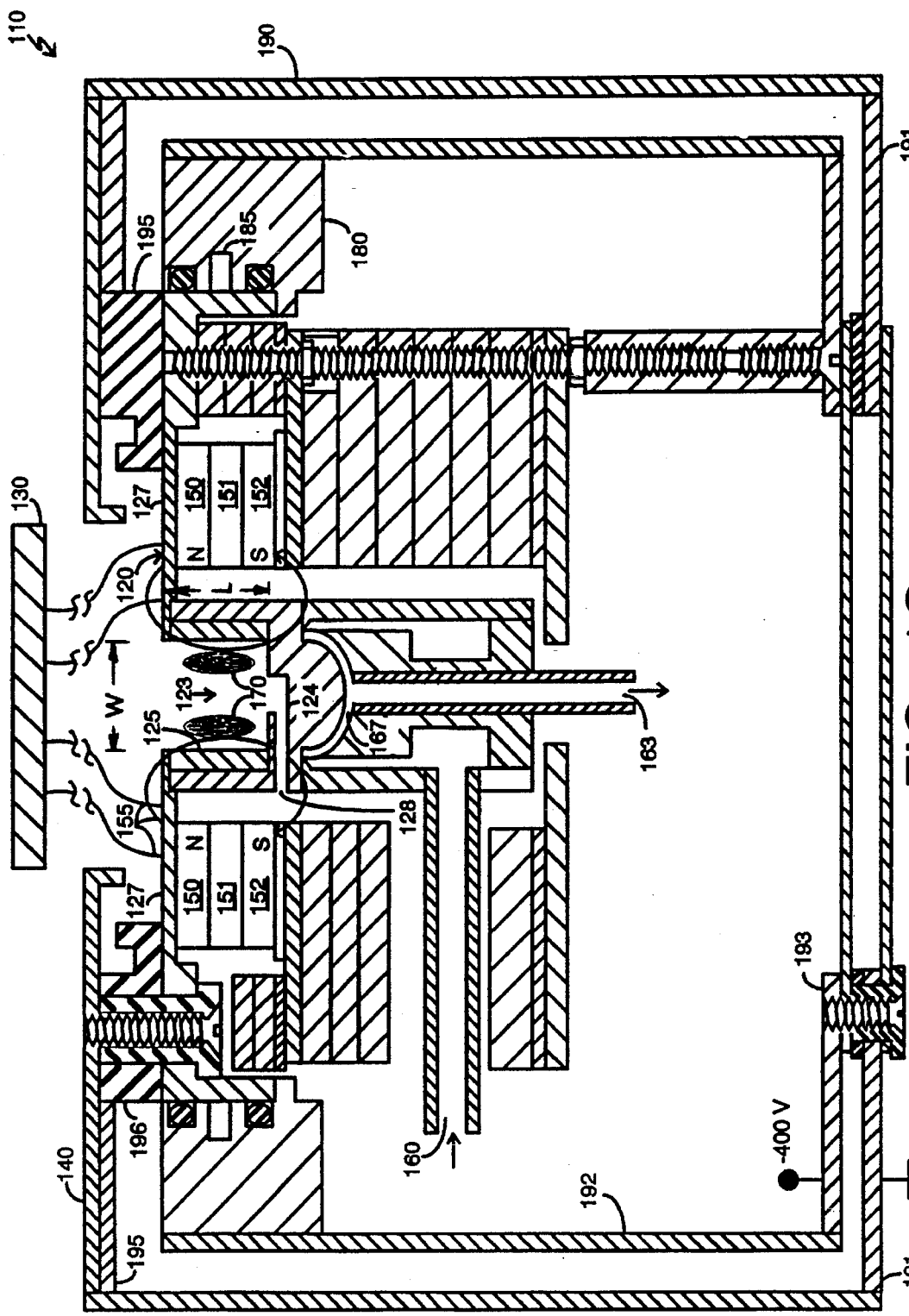
FIG. 1C is a cross-sectional view of an embodiment of the present invention using a high intensity magnetron sputter source as a plasma forming means.

FIG. 1C is a cross-sectional view of a high-intensity magnetron sputter source 110 of a type which is useful in practicing the present invention. The sputter source 110 consists of a cathode 120 having a hollow, generally cup-like portion 123 comprising a planar bottom 124 of diameter W and a cylindrical wall 125 of height L. Cathode 120 also has an annular planar upper surface 127. Cathode 120 serves as a sputter target and is, therefore, made of a material, such as aluminum, which is to be deposited onto a substrate 130. As will be described in further detail below, the plasma formed in the sputter source is concentrated within the hollow cup-like portion 12 of cathode 20, and, as a consequence, most of the sputtering will occur from within cup-like portion 123. W is preferred to be less that 1.0 inch and less than L. This configuration confines the sputtered atoms for a more intense plasma. The region of most intense plasma discharge is indicated by the reference numeral 170, however, it should be understood that the plasma extends beyond the shaded area 170 of greatest intensity as described below. Only a relatively small amount of material is sputtered from upper surface 127. Accordingly, as shown in FIG. 1C, the cup-like cathode portion 123 may be fabricated as a separate piece from planar cathode portion 127 so that it can be separately replaced after it is eroded to a useful end-of-life. Indeed, since most of the erosion will be of cylindrical wall portion 125, that piece of cathode 120 may be fabricated separately from cathode bottom 124 provided that good thermal contact with the cooling means is maintained as described below. In FIG. 1C cylindrical wall portion 125 is shown as a separate insert within cathode cup 123. Gas inlet 128 is located within cathode cup 123 to allow introduction of an inert gas, such as argon, which is used to form a plasma.

Substrate 130 may be a semiconductor wafer, typically made of pure, single-crystal silicon, which has already gone through various processing steps whereby a number of layers of a VLSI circuit have been formed. In the interest of clarity, in FIG. 1C substrate 130 and the distance between the substrate and the sputtering source 110 are not to scale. Deposition of a metal layer over the partially formed devices on the wafer surface is a well-known step in the fabrication of VLSI circuits or "chips". Frequently, it is necessary to deposit metal deep within a via or groove on the wafer surface to provide an electrical connection. However, while the present invention is described in terms of depositing a metallic layer onto a semiconductor substrate, it is not intended to be limited to that application. It will be apparent to those skilled in the art that the present invention is equally advantageous for deposition onto other types of substrates.

An anode 140, typically held at ground potential, is used to create a potential difference in respect to the target cathode 120, which may be held at several hundreds volts negative. At the gas pressures typically used, and in view of the geometry shown, a voltage between −400 v and −500 v may be used.

Stacked annular magnets 150, 151 and 152 create a novel fringing magnetic field having field lines 155 that loop through the side wall 125 of cathode cup portion 123 but which also form a magnetic null-field region immediately above the open portion of the cathode. These field lines form a magnetic cusp which helps concentrate and confine the plasma, thereby sustaining the discharge. Use of looping magnet fields to confine a plasma near a target, per se is well known in the art of sputtering.

High intensity sputter source 110 also includes a water cooling system for preventing overheating of target cathode 120. Such overheating could lead to catastrophic failure of the system. As described below, the present invention employs a plasma power density substantially greater than that used in prior art sputtering systems. Thus, the need for efficient cathode cooling is even greater than with known sputtering systems.

Water, or other suitable coolant fluid, enters the cooling system via input conduit 160, and leaves the system via output conduit 163. Between the input and output conduits is a heat exchanger 167, which is designed to produce turbulence in the cooling fluid, thereby enhancing the cooling efficiency. A separate water cooling jacket 180, comprising conduit 185, may also be included to further control the temperature of the source 110. Means for circulating the coolant fluid are well known to those skilled in the art and need not be discussed further. An additional cooling jacket (not shown) may be used to surround cylindrical wall portion 125 which is subject to the greatest heating. As the sputter source is operated, thermal expansion of cylindrical target portion 125 causes the wall to come into firm contact with the surrounding cooling jacket, ensuring that adequate thermal contact is maintained.

The overall source 110 further comprises a cylindrical outer wall 190 and annular bottom wall 191 which are held at ground (i.e., anode) potential. Insulators 195 and 196 electrically isolate the anode 140 from the cathode 120. Cylindrical inner wall 192, which is coaxial with and spaced closely to cylindrical outer wall 190, and annular inner bottom wall 193, which is parallel to and spaced closely to outer bottom wall 191, are at held at cathode potential and serve as screens to suppress parasitic discharges. The overall source 110 is designed to be operated within a vacuum chamber, not shown. It should be apparent to those skilled in the art that a source, like that shown in FIG. 1C, can readily be constructed, in which only the front portion, i.e., the portion facing wafer 130, is within the vacuum chamber. With proper sealing, the backside of the source can be held at atmospheric pressure. Such a configuration offers many advantages.

Generally, the magnetron sputter source of the present invention operates similarly, in many respects, to a normal sputtering source of the type which is known in the prior art. A vacuum chamber (not shown) is pumped down to a sufficiently low pressure, which may be, for example, $10^{-5}$ torr or less. A small quantity of an inert gas, such as argon, is introduced into the vacuum chamber raising the pressure in the chamber to 1–5 millitorr, for example. In our preferred embodiment, argon is introduced directly into the cathode cup via inlet 128 so that it is present in greatest concentration where the plasma discharge is to be initiated. By introducing the plasma gas directly into the cathode cup it is possible to lower the overall system operating pressure. A plasma discharge is then created, in a known manner, by applying a high negative voltage on target cathode, as described above. The plasma 170 is concentrated by the magnetic field lines 155 primarily into an area adjacent to a surface of target cathode 120. Gas ions are formed in the plasma and strike the surface of the sputter target causing neutral atoms of the target material, typically a metal such as aluminum, to be ejected from the surface of the target. Generally speaking, the direction of travel of an ejected atom may be in any random direction.

Since the sputtered atoms of a typical prior art sputtering device are neutral, their trajectories are not influenced by the standard magnetic or electrostatic means which can be used to control the trajectories of ions and electrons. Moreover, due to the pressure ranges normally used in sputtering systems, the mean-free-path of an ejected atom is relatively short in comparison to the distance between the target cathode and the substrate. This leads to gas scattering, further randomizing the direction of travel of the metal atoms as they move from the target cathode to the substrate. In view of these facts, prior art sputtering sources are unable to impart a high degree of directionality to the metal atoms incident on the surface of the substrate. As noted above, the angle of incidence of the atoms deposited on the substrate generally conforms to a cosine distribution. As is also described above, the prior known means of improving the directionality of the sputtered atoms have not proved to be either efficient or practical.

As device geometries shrink, the inability to provide a sputter source with high efficiency and which provides satisfactory directionality is beginning to become a limiting factor in the utility of sputtering as a method of depositing metal in narrow grooves or vias. The present invention is intended to overcome the limitations of the prior art.

One distinguishing feature of the present invention is in its use of a plasma which is sufficiently intense to cause ionization of not only the gas atoms, but also of a large number of atoms of the material to be deposited. As used herein, the term high intensity plasma should be understood to mean a plasma which is sufficiently intense to cause a substantial number of the atoms of the material being sputtered to ionize. The intensity of a plasma is directly related to plasma density. It is estimated that the maximum plasma density of a prior art magnetron sputter source is about $10^{12}$ particles/cc. The high intensity plasma of the present invention should, preferably, have a density an order of magnitude greater than this, i.e., about $10^{13}$ particles/cc or even greater in the area of greatest intensity.

As explained below, it is believed that at least some of the benefit of the present invention with respect to metallization of a silicon substrate can be realized where the percentage of ions of the sputtered material being deposited is as low as approximately ten percent. It is understood that prior art magnetron sputter sources provided approximately 1% or less of the sputtered material in ion form. There are other uses for an ion source of this invention, which may benefit when less than 10% ions are provided in the beam. Accordingly, the term a substantial number in connection with wafer metallization, when used in reference to the number of metal atoms that are ionized, should be understood to mean approximately ten percent or more. Preferably, the number of atoms of target material that become ionized should be much greater than this minimal amount.

The mechanism whereby metal atoms are ionized is well known and need not be explained in detail. Simply put, the metal atoms become ionized by the same mechanism that causes ionization of the gas atoms, i.e., the atoms lose one or more electrons when struck by a sufficiently energetic particle. Since the ionization potential of aluminum is approximately 6 electron volts (ev), it is not difficult to create aluminum ions within the plasma. Nonetheless, due to the low intensity of the plasma in prior art sputtering systems, and in view of the geometry of such systems, wherein neutral atoms of target material are likely to travel only a short distance through the plasma, it is believed that less than one percent of these neutral atoms typically become ionized in known prior art systems.

A high intensity plasma is needed to create a sufficient number of metal ions to provide an acceptable deposition rate. Depending on the target material, once a sufficient number of metal atoms become ionized, they may be able to support the plasma alone, i.e., argon would no longer be needed to maintain the plasma or to cause sputtering of target material. Thus, it is within the scope of the present invention to use a flow of argon or other inert gas only for the purpose of initiating the plasma; the gas flow may then be stopped once the plasma is initiated and stabilized.

In order to form a high-intensity plasma it is necessary to create an intense magnetic field in a small region and to have a sufficiently high power input into that region. In order to do this efficiently, a hollow cup-shaped cathode 120, as shown in FIG. 1C, is used in one embodiment. This shape of cathode is highly suitable for creating a concentrated plasma, since it facilitates the creation of an intense confining magnetic field within the "cup" by use of surrounding permanent magnets 150, 151, 152. Although permanent magnets are shown and preferred, it will be readily apparent to those skilled in the art that a plurality of electromagnets could be arranged to provide a null region and a looping field. Likewise, while a plurality of stacked magnets are shown, it would be obvious to substitute a single permanent magnet therefor. In addition, the geometry of the cup where L is slightly larger than W and where W is on the order of 1.0 inch increases the likelihood that a neutral atom released from the target will be present within the intense plasma long enough to be ionized.

The plasma discharge is also intensified by increasing the power delivered to the plasma. As is well known to those skilled in the art, the power delivered to the plasma is primarily a function of the current. The voltage used to create the plasma tends to remain fairly constant for a given pressure and geometry. Stated equivalently, a slight increase in voltage will result in a marked increase in current through the plasma. In an embodiment of the present invention a power level of two kilowatts is used. Given that the power is mostly concentrated into an area less than one inch in diameter, this power level provides a power density which is far greater than, by approximately an order of magnitude, that used in known prior art sputtering systems.

Creating metal ions in sufficient numbers is only part of the solution. Once ions are created, the prior art could not directionally extract them from the plasma in sufficient numbers for deposition. Thus, another distinguishing feature of the present invention is that it includes means for bringing the plasma into "contact" with the face of the wafer. As described earlier, the magnetic null region creates a magnetic cusp which permits ions and electrons to leak out of the plasma container in a beam. When the beam is brought into contact with the face of a substrate, such as a wafer, the plasma naturally forms a very thin low-voltage sheath between the plasma and the wafer surface. (In fact, due to this sheath the plasma does not actually "touch" the wafer surface. Thus, when we speak of the plasma "contacting" the wafer, it should be understood that this means bringing the plasma close enough to the surface of the wafer so as to cause the creation of a sheath.) When the wafer is allowed to "float" electrically, this thin sheath, which may typically be approximately 10 μm thick, has a potential in the range of tens of volts, with the wafer surface naturally becoming negative in respect to the adjacent plasma boundary. It will be understood by those skilled in the art that the thickness of the sheath and the potential across it are related to the plasma density.

The creation of a sheath between a plasma and a solid surface is a known phenomenon. While a detailed understanding of this phenomenon is not necessary to practice the present invention, and is beyond the scope of this disclosure, in simple terms the mechanism whereby a potential is created can be thought of as being related to the difference in the velocities between the negative electrons and the positive ions which make up the plasma. Overall, the plasma is electrically neutral so that the net charge of electrons offsets the net charge of the ions. Assuming the ions each have a single positive charge, the numbers of electrons and ions will also be the same. In any one region the temperature of plasma will be locally constant. An electron, being much less massive than an ion, will have a far greater average velocity at a given temperature than the ion. This much greater velocity translates into greater mobility. Thus, at the edge of the plasma adjacent the surface of the substrate, electrons migrate much more quickly to the surface of the substrate causing the build-up of a negative charge. After a short time, the negative charge on the substrate builds to the point that electrons approaching the surface of the substrate are repelled and positive ions are attracted. An equilibrium condition is reached when the net flow of electrons, which is opposed by the charge build-up, is equal to the net flow of ions, which is enhanced by the charge build-up. At this point, although there is a continuous flux of electrons and ions incident on the surface of the substrate, there is no further net transfer of charge. A steady-state potential difference, of the order of tens of volts, thereafter exists between the plasma edge and the substrate surface.

The present invention can employ the properties of this plasma sheath to cause directional deposition of metal ions. Metal ions in the plasma, being positively charged, are attracted and accelerated toward the negatively charged wafer surface. The potential gradient across the plasma sheath is normal to the surface of the wafer. The ion velocities in the plasma, being temperature related, are relatively low in comparison to the velocity caused by the potential gradient. Typically, the thermal energy of the ions will be, on average, a few electron volts. On the other hand, the kinetic energy imparted to the ions as they are accelerated across the sheath will be of the order of tens of electron volts. Thus, when they reach the wafer surface after being accelerated across the sheath, the ions are generally travelling at an angle which is close to normal. Accordingly, by using this technique it is possible to impart a high degree of directionality to the ions deposited as a film, thereby addressing the problem of filling deep vias and thin grooves. In view of the fact that the plasma leaks out of the cathode cup configuration in an axially directed beam, which exhibits a waist as it passes through the null region, the beam is essentially decoupled from the plasma in the container. Accordingly, the beam is able to be steered and scanned by standard electrostatic and electromagnetic techniques without disrupting the plasma in the container.

As described above, ions which traverse the sheath and are deposited on the wafer are neutralized by electrons from the plasma. Since there is no net charge transfer to the wafer when the wafer is floating, the potential gradient across the sheath remains constant throughout the deposition process.

To this point the potential across the plasma sheath has been discussed in the context of a wafer which was allowed to "float" electrically. By applying an rf bias to the wafer, for example, at a frequency of 13.5 MHz, it is possible to control the sheath voltage independently of the plasma density. A higher voltage than the sheath voltage may also be desired, for example, for the reasons described below.

It should be understood that not all the metal atoms ejected from the surface of the sputter target need be ionized. Thus, neutral atoms will be present in the plasma and will be deposited on the wafer surface in a conventional manner. The ratio of neutral atoms deposited to ions deposited will be a function of the geometry of the system and the intensity of the plasma. However, even if only a relatively small proportion, e.g., 10%, of the deposited material is due to ions having the desired directionality, the improvement in filling vias and grooves is a significant advance over the prior art. Moreover, it is believed that the relatively much more energetic ions striking the wafer surface impart surface mobility to the neutral atoms causing them to spread out along the surface, thereby enhancing the ability to fill vias and grooves with the neutral atoms. This later phenomenon may be significant in determining, as a practical matter, the optimal level of ionization of the neutral atoms of the material to be deposited. The optimal degree of ionization, has not been determined. However, it is unlikely that the optimum is one hundred percent ionization. At some point, further increasing the percentage of ionization, which is costly in terms of power consumption and cooling requirements, may not yield any better results in filling vias and grooves.

While the ions deposited in accordance with the present invention are much more energetic than neutral atoms deposited in accordance with prior art sputtering techniques, they are not so energetic as to cause damage to the substrate. In particular, ions having an energy of less than approximately 100 ev will not cause damage to the wafer. This damage-causing energy level is well above the energy of metal ions deposited in accordance with the present invention.

Magnetic field lines 155 from magnets 150, 151 and 152 also loop upwardly above the top of upper annular cathode portion 127, filling the space between the anode and the wafer except in the null region. It should be understood that the intensity of the plasma will be greatest within the cathode cup. In particular, the plasma will be most intense in a doughnut-shaped region adjacent cup wall 125. As noted above, the density of the plasma adjacent the substrate will be less than the density in cathode cup. It is estimated that the plasma density near the substrate may be an order of magnitude lower.

In the basic embodiment of the present invention, as shown in FIG. 1C, the diameter of the cylindrical hollow cathode portion 123 may be less than an inch in diameter. This is significantly less than the diameter of a typical semiconductor wafer, which may be as large as eight inches.

The specifications for most modern semiconductor processes require that a deposition source achieve a very high degree of "uniformity." The term uniformity as used in this context refers to a requirement that the thickness of the deposited layer at different points on the surface of the wafer be the same within a small tolerance. The deposition rate at a region of the substrate will generally be a function of the density of the plasma adjacent to that region. Accordingly, uniformity requires that the plasma density be nearly the same over the entire surface of the substrate.

In view of the size difference between the cathode of the FIG. 1C embodiment of the present invention and the size of a wafer, if the wafer is placed too close to the cathode the uniformity of the deposited layer will be poor. The density of the plasma in contact with the wafer, and hence the population of metal ions attracted to the wafer, will be greater near the center than at the edges of the wafer. Moreover, as described above, there will continue to be deposition of neutral metal atoms from the sputter target and these, too, will be more concentrated near the center of the wafer due to the geometry of the arrangement.

One way to improve uniformity would be to place the wafer at a substantial distance from the cathode. However, as the distance is increased the efficiency of deposition, both in terms of deposition rate and target material utilization, decreases. Another way to improve uniformity would be to use a specially configured magnetic field to cause the plasma originating from a relatively small source to spread out evenly over the entire surface of the wafer. Ideally, the magnetic field should be normal to the surface of the wafer since it has an effect on the trajectories of the ions being deposited on the surface. It is believed that it would be difficult to design a magnet configuration which would cause the plasma to spread out while, at the same time, having field lines perpendicular to the wafer surface.

Annular anode 140 is isolated from cathode 120 by insulation disks 195 and cylindrical insulator 196. The anode has a shield lip on its inner edge nearest the plasma container. The lip is intended to reduce the line of sight and shield the insulator 195 on its inner periphery from being coated with sputtered metal to avoid shorting.

FIGS. 2 and 3 show a cathode structure in accordance with another embodiment of the present invention which improves the deposition uniformity without need to sacrifice efficiency. The embodiment of FIGS. 2 and 3 has the added advantage of providing a much larger target which, therefore, is capable of delivering a far greater amount of material before it is eroded to end-of-life. In this embodiment the cathode 220 comprises a planar top portion 227 and an annular grooved portion 223 having inner and outer annular side walls 225 and 226, respectively, and an annular bottom 224. As shown in FIG. 3, annular magnets 350 and 351 surround inner and outer walls 225, 226 of the groove, respectively. Also as shown in FIG. 3, the bottom of cathode groove 224 may include a channel 360 for circulating cooling water. This cooling water channel may also include means, not shown, for inducing turbulent flow to improve heat exchange efficiency. In this embodiment, the plasma is most intense within the groove, and most of the material that is to be deposited is removed from within the groove. Since erosion will be greatest within cathode groove portion 223, this portion of the cathode may be separately fabricated and mounted so that it may be replaced without the need to replace planar cathode portions 227 which are not subject to much erosion.

The magnetic field produced by annular magnets 350 and 351 is such that an intense magnetic field 355, which loops through the side walls of the groove, is formed. When a discharge is started, this magnetic field concentrates a high intensity plasma 370 within the groove. As shown, both magnets have the same magnetic pole adjacent to cathode planar portion 227. Accordingly, the magnetic field lines loop upwardly above each of the magnets toward the wafer (not shown) causing the plasma to spread out and contact the wafer. The magnets also produce a null region adjacent to the opening of the plasma confining groove as described earlier, providing the same extraction mechanism for the groove as described earlier for the gollow container.

As in the embodiment of FIG. 1C, in order to create a plasma of sufficient intensity, the distance W between the walls of the groove is substantially smaller than the diameter of a substrate wafer to be coated. Due to the geometry, it can be shown that a circular source will result in greatly improved uniformity of deposition without the need to position the wafer too great a distance from the cathode. Moreover, using this configuration it is possible to increase the overall power delivered to the source, and thereby the amount of material removed from the target, without increasing the power density at any particular location. In effect the power is spread out over a much larger area.

The cathode embodiment of FIGS. 4 and 5 is designed to provide even greater uniformity than the previously described embodiments. This embodiment is similar to the embodiment of FIGS. 2 and 3, but comprises a labyrinth groove 423 to allow a high intensity plasma to be created over a large area. Again, the cathode 420 comprises a planar upper portion 427 and a labyrinth groove portion 423. In accordance with the labyrinth configuration of this embodiment, cathode 420 includes only a single groove in the sense that all the grooves are connected and, thus, only one serpentine high intensity plasma 570 is created. The use of a single groove in the embodiment of FIGS. 4 and 5 is deemed significant insofar as it more difficult to sustain high intensity plasmas in a plurality of separate grooves in a single system. Accordingly, even though it is more difficult to construct, a single groove labyrinth is preferred, for example, than a plurality of separated concentric circular grooves. Again, the labyrinth design is able to deliver far more target material before reaching its useful end-of-life than either of the previously described embodiments.

The cathode embodiment of FIGS. 4 and 5 functions in much the same way as the other cathode structures previously described, i.e., a high intensity plasma is created in the groove by the fringing field lines 455 of magnets 550–555 and is brought into contact with the wafer (not shown) above the cathode by the magnetic field. Again, the overall area of intense plasma is markedly increased, thereby increasing the overall power delivered to the plasma, without the need to increase local power density. At these intensities, cooling via channel 560 is important to prevent damage to the structure by overheating FIG. 6 shows another embodiment of the present invention which uses microwave energy to even further increase the number of metal atoms which become ionized within the plasma. The microwave energy further intensifies the plasma. This embodiment includes a hollow cathode confinement container 620 similar to that described in connection with FIG. 1. The cathode 620 comprises a planar portion 627, and a cup-shaped portion 623 including a cylindrical wall 625 and a bottom 624. Cathode 620 is surrounded by an annular magnet 650 which produces field lines 655 which loop through cylindrical wall 625 and outwardly from planar cathode portion 627 toward a substrate 630. A cathode cooling system comprising an inlet 660 and outlet 663 and a heat exchanger 667 is provided to maintain the cathode at a controlled temperature. This configuration would be a particularly useful in increasing the amount of power to the plasma when the cooling capability of a given cathode container has been maximized since the microwave cavity can be separately cooled.

The microwave power is delivered by a resonant cavity 680 tuned to the frequency of a microwave source (not shown). The frequency of the source may conveniently be 2.45 GHz. The rf energy is delivered to cavity 680 via connector 685. The generally cylindrical cavity has a central aperture which is approximately the same dimension as, and positioned to be coaxial with, cathode cup 623. Inner and outer flanges 687 and 688, respectively, are mounted on the periphery of the apertures through the cavity to prevent microwave leakage.

Again, in this embodiment the plasma 670 is brought into contact with the surface of the wafer 630 by the spreading field lines of magnet 650. Microwave cavity 680 does not contribute to spreading the plasma but, rather, merely intensifies the plasma by causing greater ionization in the region of the null of the metal atoms released from the target cathode 620.

Although the present invention has been described in detail with reference to the embodiments shown in the drawings, it is not intended that the invention be restricted to such embodiments. It will be apparent to those skilled in the art that various departures from the foregoing description and drawings may be made without departing from the scope or spirit of the invention. Therefore it is intended that the invention be limited only by the following claims.

What is claimed is:

1. A sputter magnetron comprising:
   a. high intensity plasma inducing means, said high intensity plasma inducing means including,
      i) a sputter cathode, said sputter cathode being a particle confining container having walls and one open side to permit extraction of ions from said container, said walls having an inner surface being of a selected target material, said sputter cathode including means to apply a voltage to said sputter cathode;
      ii) means to provide and maintain electrons in said particle confining container;
      iii) magnetic field generating means for providing a null magnetic field value at a region adjacent to said open side of said sputter cathode container and for providing magnetic field lines which loop through said sputter cathode walls thereby providing forces, in operation, for retaining said electrons adjacent to at least a portion of said sputter cathode walls; and
   b. ion extraction means, wherein said null magnetic field value region comprises a portion of said extraction means, said ion extraction means cooperating, in operation, with ions near said null value region to induce those said ions to exit said cathode container and to follow a path determined by said ion extraction means.

2. The sputter magnetron of claim 1 whereby said ion extraction means includes;
   a. in operation, a plasma, said plasma being within said sputter cathode, wherein said plasma reaches a steady state condition and wherein said plasma in said sputter cathode has a first positive plasma potential as a result of electron leakage from said plasma; and
   b. means to establish an electric field sheath potential between said plasma and a first surface remote from said container, said electric field sheath potential being of a polarity to attract positive ions from said plasma to said first surface, and wherein said plasma in the region of said first surface remote from said container has a second plasma potential, said second plasma potential being less positive than said first positive potential.

3. The sputter magnetron of claim 2 including means for providing at said first remote surface a semiconductor workpiece to be plated with positive metal ions from said plasma.

4. The sputter magnetron of claim 3 wherein said electric field sheath potential between said plasma and a said semiconductor workpiece is more negative than said second plasma potential.

5. The sputter magnetron of claim 2 including:

means for further increasing the concentration of ions of the material of said sputter cathode in said sputter cathode container, said means for further increasing the concentration of ions in said sputter cathode container being means for causing an electromagnetic wave interaction with said plasma which provides energy to said plasma and decreases the mean free path of neutral atoms of said sputter cathode material after said neutral atoms have been knocked off the surface of said cathode by ion bombardment from said plasma.

6. The apparatus of claim 5 including an electromagnetic wave transmission means to introduce said electromagnetic wave energy to the vicinity of said plasma.

7. The apparatus of claim 6 wherein said vicinity of said plasma encompasses said null region.

8. The apparatus of claim 1 wherein said high intensity plasma is on the order of $10^{13}$ particles/cc or greater.

9. The apparatus of claim 8 wherein said particle confining container is at least one groove having a width W on the order of one inch or less.

10. The apparatus of claim 9 wherein said at least one groove is a plurality of grooves.

11. The apparatus of claim 10 wherein said grooves are interconnected so that only one simultaneous continuous plasma loop exists, in operation.

12. The apparatus of claim 11 wherein, in operation, said high intensity plasma contains a percentage of ions of said target material greater than 2.0 percent.

13. The apparatus of claim 12 including means for mounting a semiconductor workpiece to be plated with said target materials ions exiting said cathode container from near said null point.

14. The apparatus of claim 8 wherein said particle confining container is cup shaped having a diameter W on the order of one inch or less.

15. The apparatus of claim 14 comprising an anode, said anode being spaced from and electrically isolated from said sputter cathode by insulation means; and means to shield said insulation means from being plated by sputtered cathode material by blocking the line of sight from said sputtered cathode to said insulation means to prevent shorting the cathode to the anode.

16. The apparatus of claim 1 wherein said particle confining container is cup shaped, having a diameter W on the order of one inch or less.

17. The apparatus of claim 16 wherein, in operation, said high intensity plasma contains a percentage of ions of said target material greater than 2.0 percent.

18. The apparatus of claim 17 including means for mounting a semiconductor workpiece to be plated with said target material ions exiting said cathode container from near said null point.

19. The apparatus of claim 16 further comprising gas port means, said gas port means being an aperture through a wall of said sputter cathode confining container, said aperture being in a wall portion remote from said open side for passage of a plasma initiating gas into said container thereby permitting lower operating pressure.

20. The apparatus of claim 16 further comprising input and output fluid conduits arranged in a heat exchange relationship with said cathode particle confining container, said conduits for conducting coolant fluid.

21. The apparatus of claim 20 wherein said fluid conduits are connected to a turbulence producing heat exchanger.

22. In apparatus for directing ions of a target material to a workpiece, comprising;

means for generating a high intensity plasma on the order of $10^{13}$ particles/cc containing a percentage of ions of said target material greater than 2.0 percent;

means for causing said plasma to contact said workpiece, whereby ions of the target material to be deposited present in said plasma are directed to said workpiece at an angle which is generally normal to the surface of said workpiece;

magnetic field producing means;

said means for generating a high intensity plasma comprises magnetron sputter source means, including a target cathode comprising said material to be deposited on said workpiece, said target cathode comprising a plasma confining container having opposed plasma confining walls and one open side, opposed plasma confining walls being separated by a small distance W on the order of one inch and wherein said magnetic field producing means provides magnetic flux lines which are primarily parallel to said opposed confining walls and wherein said magnetic field producing means further provides a magnetic null region near said one open side.

23. The apparatus of claim 22 wherein said plasma confining container comprises a groove.

24. The apparatus of claim 23 wherein said groove forms an annulus.

25. The apparatus of claim 23 wherein said groove forms a labyrinth.

26. The apparatus of claim 22 further comprising means for cooling said magnetron sputter source.

27. An apparatus for depositing a thin film on a planar substrate in a vacuum chamber comprising:

high intensity magnetron sputter source means including a target cathode made from a material to be deposited for producing a plasma comprising greater than 10 percent of ions sputtered from said target cathode;

magnetic field producing means for creating a magnetic field between said cathode and said substrate, said magnetic field having a magnetic null region;

whereby said target cathode has a generally planar face and a groove portion having opposing walls from which material to be deposited is sputtered, wherein the plasma density is greatest within said groove portion and wherein said opposing walls of said groove portion are separated by a distance on the order of one inch; and wherein sputtered atoms of said target cathode being directed toward said planar substrate have least ten (10) percent, of ionized atoms sputtered from said target cathode.

28. The apparatus of claim 27 wherein said groove is an annulus.

29. The apparatus of claim 27 wherein said groove is a labyrinth.

* * * * *